(12) United States Patent
Liu et al.

(10) Patent No.: US 8,296,947 B2
(45) Date of Patent: Oct. 30, 2012

(54) HEAT SINK AND METHOD OF MANUFACTURING THE SAME

(75) Inventors: Peng Liu, Shenzhen (CN); Guo Chen, Shenzhen (CN); Shi-Wen Zhou, Shenzhen (CN); Chun-Chi Chen, Taipei-Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 724 days.

(21) Appl. No.: 12/506,213

(22) Filed: Jul. 20, 2009

(65) Prior Publication Data

US 2010/0243229 A1    Sep. 30, 2010

(30) Foreign Application Priority Data

Mar. 27, 2009  (CN) .......................... 2009 1 0301188

(51) Int. Cl.
*B21D 53/02* (2006.01)
*H05K 7/20* (2006.01)

(52) U.S. Cl. ............... 29/890.03; 165/80.3; 165/185; 257/722; 361/704

(58) Field of Classification Search ............... 165/80.3, 165/185; 361/704; 257/722
See application file for complete search history.

(56) References Cited

U.S. PATENT DOCUMENTS

| 5,964,285 | A | * | 10/1999 | Huang | 165/185 |
| 6,134,783 | A | * | 10/2000 | Bargman et al. | 29/890.03 |
| 6,223,815 | B1 | * | 5/2001 | Shibasaki | 165/185 |
| 6,357,514 | B1 | * | 3/2002 | Sasaki et al. | 165/80.3 |
| 6,999,318 | B2 | * | 2/2006 | Newby | 361/704 |
| 2004/0150956 | A1 | * | 8/2004 | Conte | 361/709 |
| 2008/0149307 | A1 | * | 6/2008 | Tsou et al. | 165/80.3 |

FOREIGN PATENT DOCUMENTS

| JP | 05243435 A | * | 9/1993 | 257/722 |
| JP | 2006114688 A | * | 4/2006 | |

* cited by examiner

*Primary Examiner* — Leonard R Leo
(74) *Attorney, Agent, or Firm* — Altis Law Group, Inc.

(57) ABSTRACT

A heat sink includes a base with a plurality of recesses defined therein, a plurality of columned fins each having a head and a body extending from the head, and a cover joining with the base. Each head is received in and higher than a corresponding recess of the base. The heads are sandwiched between the cover and the base, whereby the columned fins are secured on the base. A portion of the cover contacting the head of each of the columned fins protrudes to form a deformed part. A method of manufacturing the heat sink is also disclosed.

12 Claims, 7 Drawing Sheets

HEAT SINK AND METHOD OF MANUFACTURING THE SAME

BACKGROUND

1. Technical Field

The present disclosure relates generally to a heat sink, and more particularly to a heat sink having a base and a cover securing heads of columned fins therebetween.

2. Description of Related Art

Generally, in order to ensure the normal running of an electronic device, a heat sink is used to dissipate heat generated by the electronic device. A conventional heat sink includes a base and a plurality of fins integrally extending from the base. However, lengths of the fins are limited by a material performance. Thus, a surface area of the fins is restricted, which impacts heat dissipation effect of the heat sink. For increasing the surface area of the fins, the base and the fins are separated first and then combined by solder or other means. Nevertheless, a cost of manufacturing the heat sink increases.

What is need therefore is a heat sink having a good heat dissipating capability and convenient and easy to manufacture.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
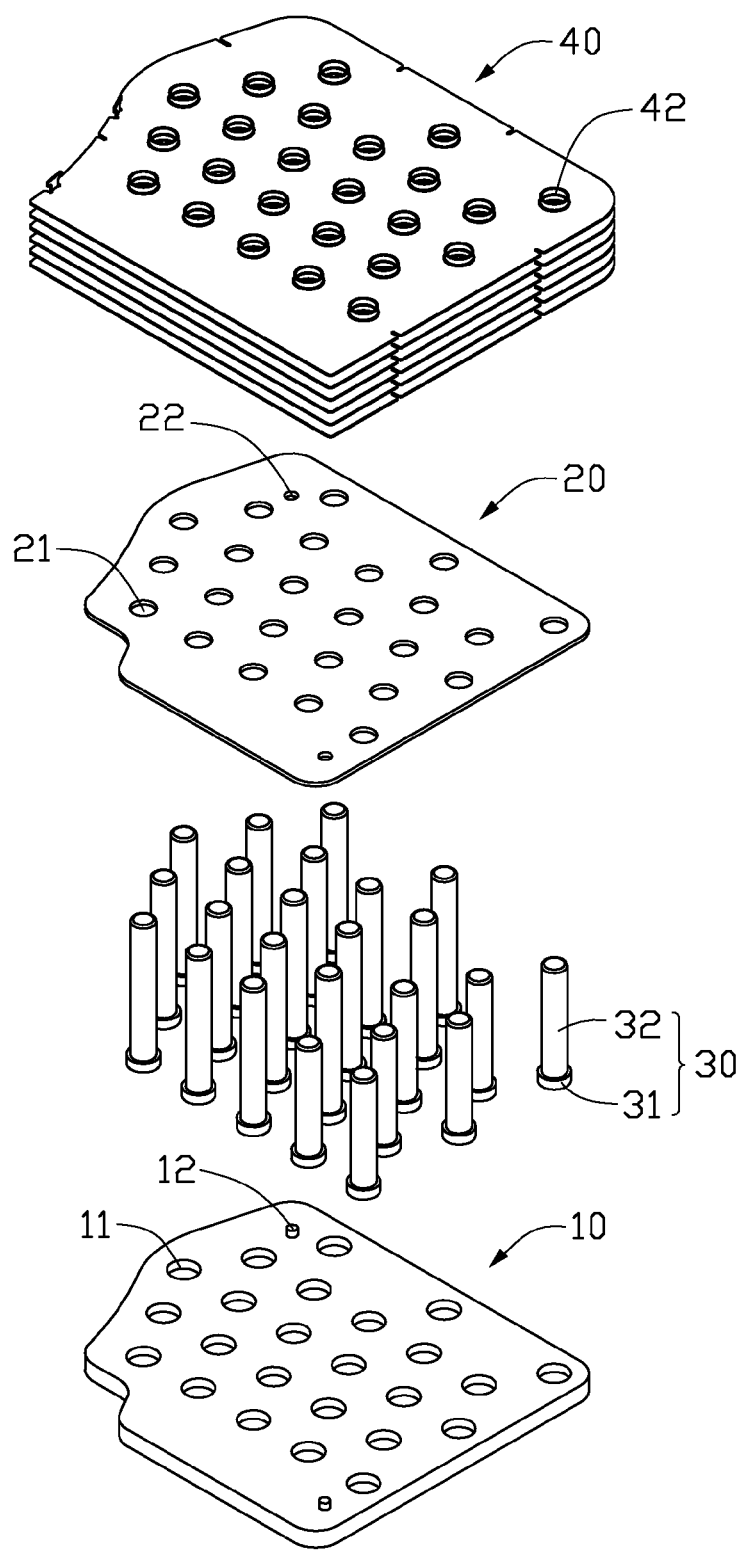
FIG. 1 is an isometric, exploded view of a heat sink in accordance with a first embodiment of the present disclosure.
Figure 2:
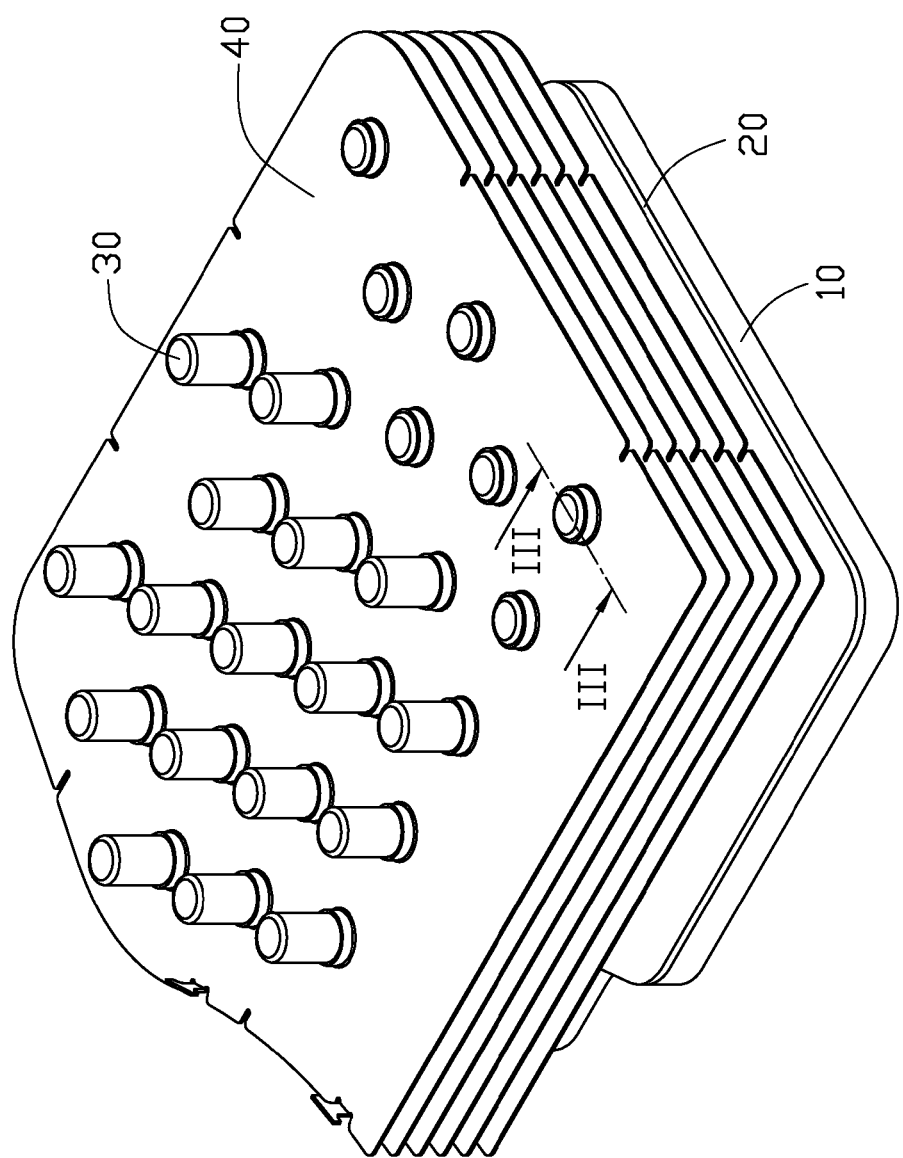
FIG. 2 is an assembled view of the heat sink of FIG. 1.

FIG. 1 and FIG. 2 illustrate a heat sink in accordance with a first embodiment of the present disclosure. The heat sink dissipates heat from a heat-generating component such as a CPU (not shown). The heat sink comprises a base 10, a cover 20 mounted on a top of the base 10, a plurality of columned fins 30 arranged on the base 10 and secured by the cover 20, and a plurality of plate fins 40 engaged on the columned fins 30. Each of the base 10, the cover 20, and the columned and plate fins 30, 40 is made of material having good heat conductivity, such as aluminum or copper.

Figure 3:
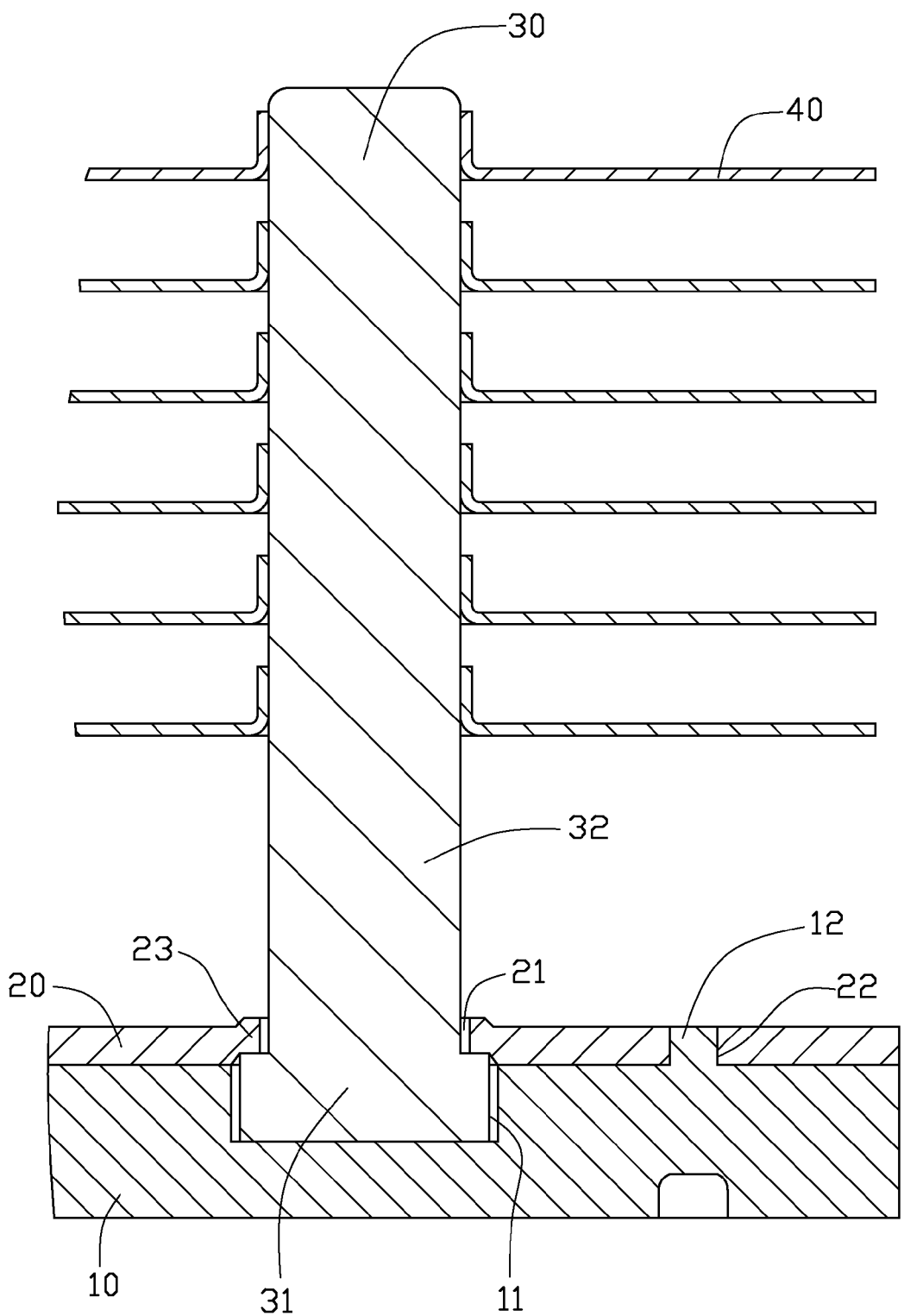
FIG. 3 is a cross-sectional view of the heat sink of FIG. 2, taken along line III-III thereof.
Figure 4:
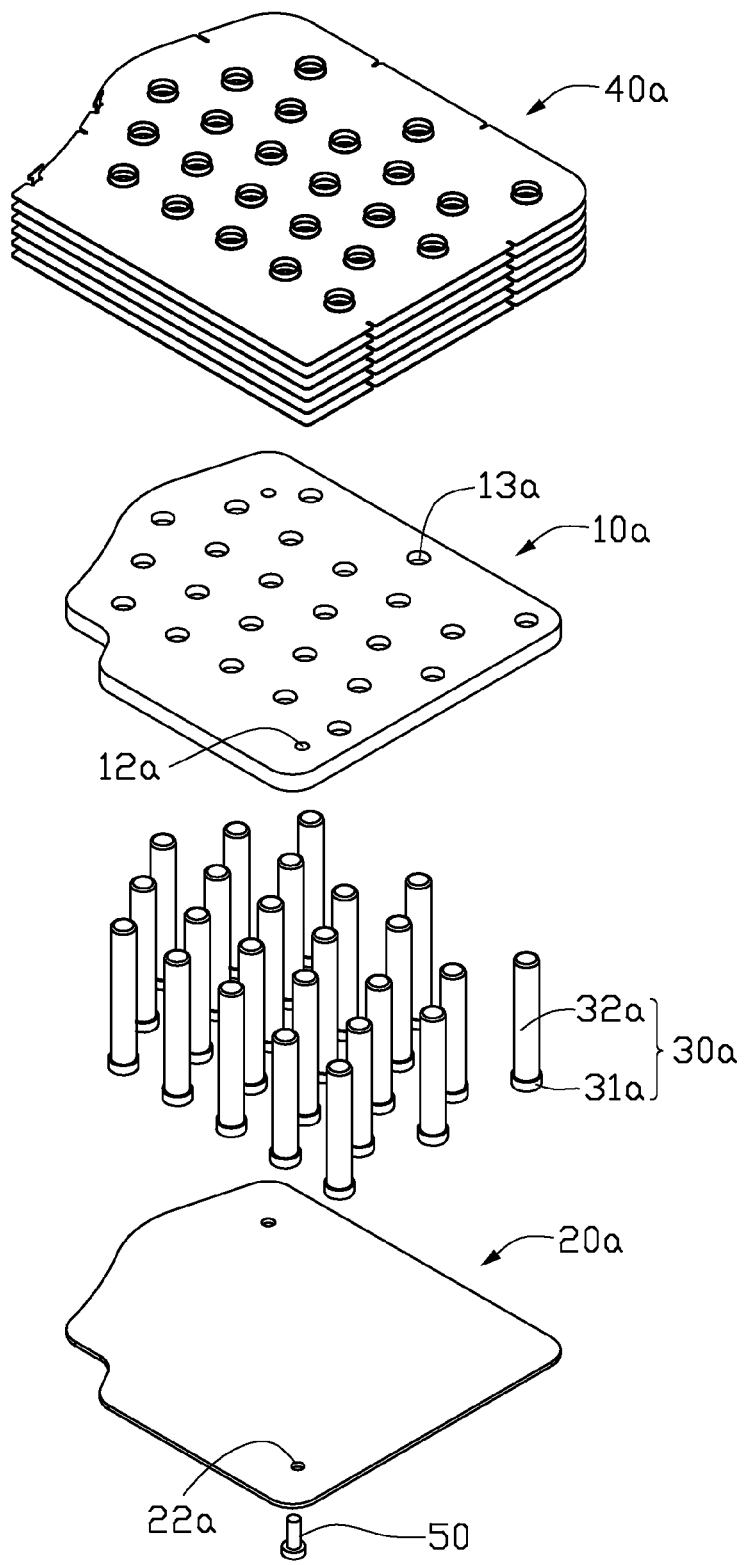
FIG. 4 is an isometric, exploded view of a heat sink in accordance with a second embodiment of the present disclosure.
Figure 5:
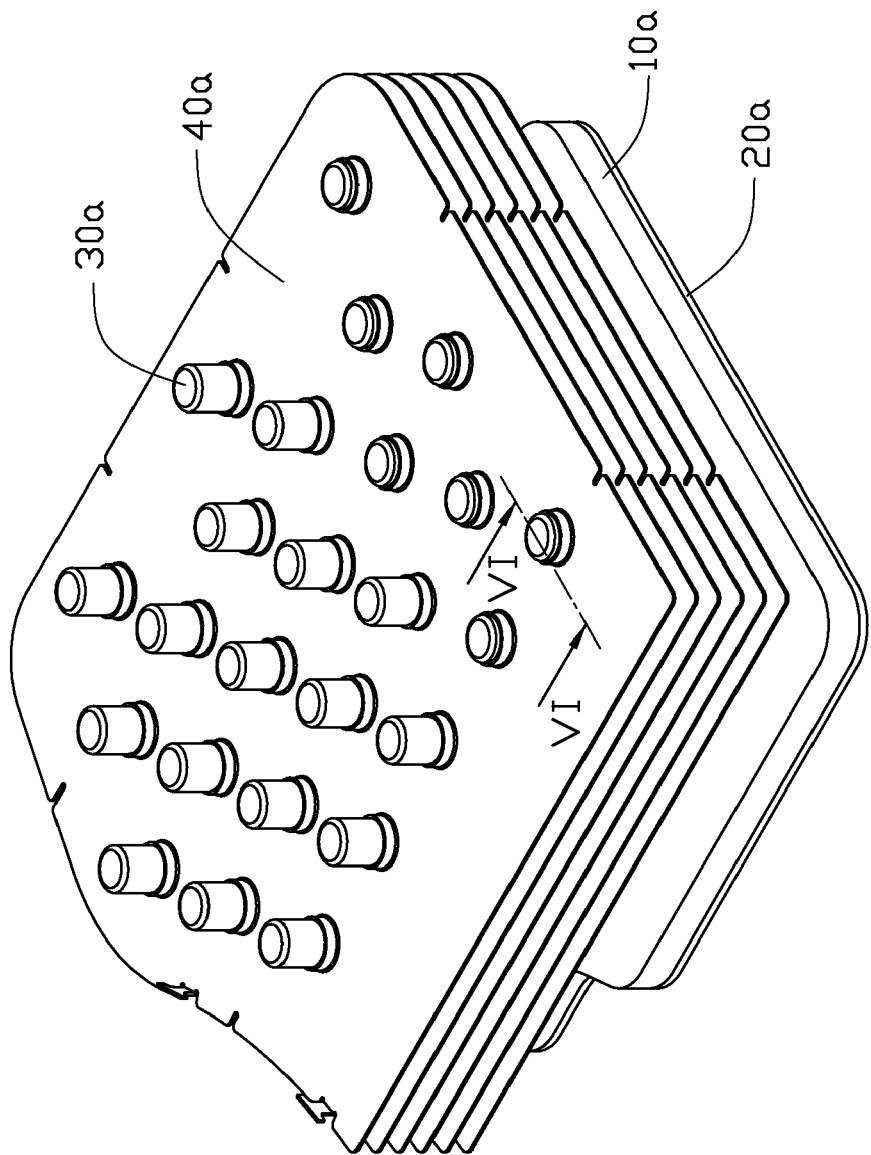
FIG. 5 is an assembled view of the heat sink of FIG. 4.
Figure 6:
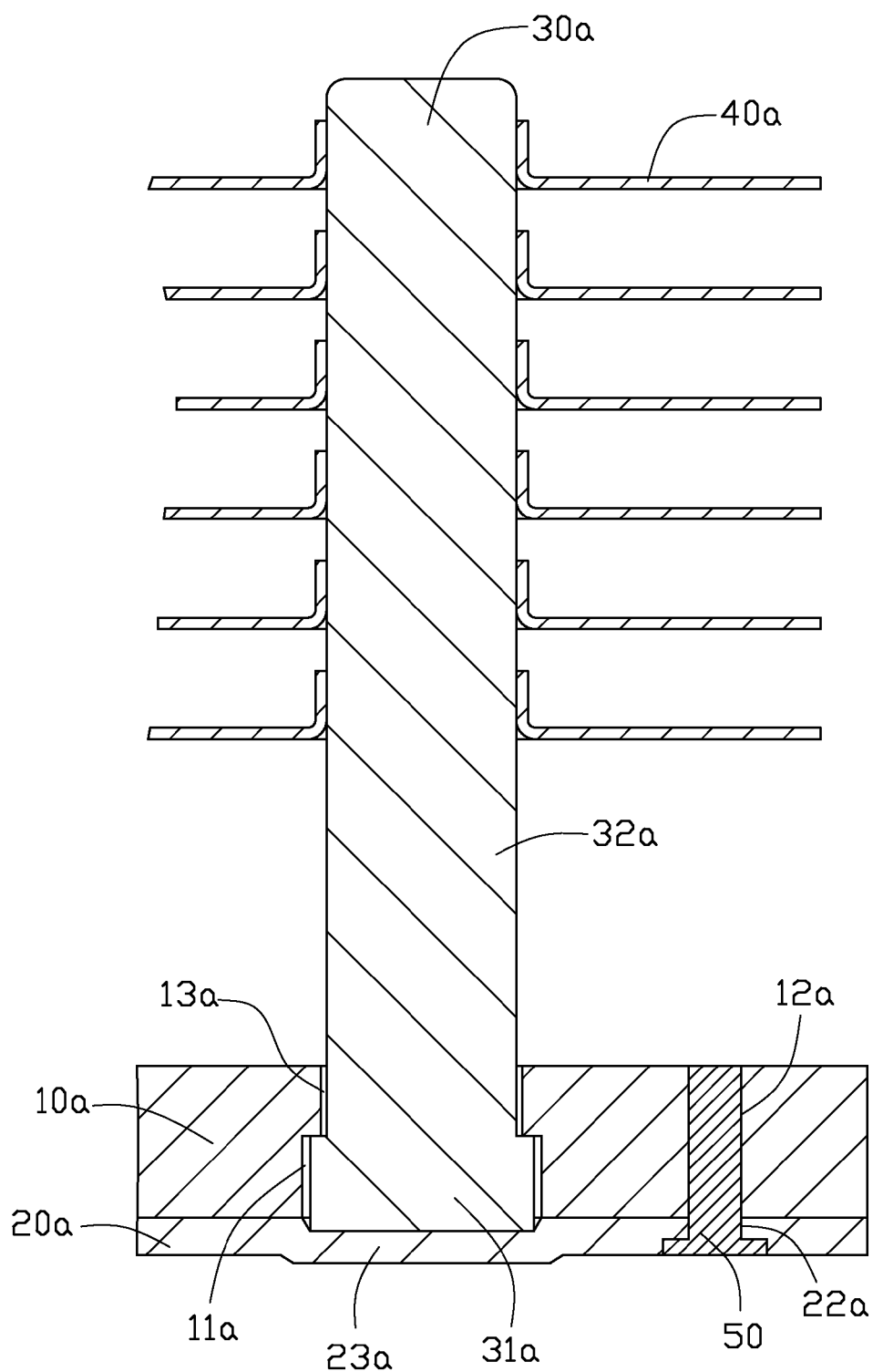
FIG. 6 is a cross-sectional view of the heat sink of FIG. 5, taken along line VI-VI thereof.

Also referring to FIG. 3, a bottom of the base 10 is for contacting the heat-generating component. A plurality of circular recesses 11 are defined in the top of the base 10; in this embodiment, the recesses 11 are blind holes. The recesses 11 are arranged in several lines in accordance with the present embodiment; of course the recesses 11 can be arranged in other forms in accordance with alternative embodiments.

Two studs 12 protrude from two diagonal corners of the base 10. The studs 12 are integrally formed on the base 10 by punching. Thus, a concave (not labeled) is defined in the bottom of the base 10 corresponding to each stud 12.

The cover 20 is a thin plate and a thickness thereof is about a quarter of that of the base 10. A plurality of holes 21 is defined in the cover 20 corresponding to the recesses 11 of the base 10. A diameter of each hole 21 is slightly smaller than that of each recess 11. Two orifices 22 are defined in two diagonal corners of the cover 20, corresponding to the studs 12 of the base 10.

Each columned fin 30 comprises a head 31 and a body 32 extending therefrom. Understandably the columned fins 30 can be square, prism or other shape in alternative embodiments, when the shapes of the recesses 11 and the holes 21 are changed accordingly. Left columned fins 30 are higher than right columned fins 30, which render tops of columned fins 30 to be at different levels. The head 31 is bigger than the body 32; that is to say, the head 31 has a diameter larger than that of the body 32, and the columned fin 30 has a T-shaped profile in longitudinal section. The head 31 is received in the recess 11 of the base 10. The head 31 is slightly higher than the recess 11; that is to say that the head 31 has a thickness larger than a depth of the recess 11. Preferably, the head 31 is 0.05-0.15 mm higher than the recess 11. Thus, a top end of the head 31 is extended out of the recess 11. The body 32 is slightly smaller than the hole 21 of the cover 20, and the head 31 is bigger than the hole 21; the hole 21 has a diameter larger than that of the body 32, but smaller than that of the head 31, whereby the body 32 can be inserted through the hole 21 of the cover 20, and the cover 20 can mount on the top end of the head 31 to secure the head 31 between the base 10 and the cover 20.

The plate fins 40 are parallel to each other. A plurality of holes 42 are defined in the plate fins 40 to allow the bodies 32 of the columned fins 30 to extend therethrough and thereby securing the plate fins 40 on the bodies 32 of the columned fins 30.

In assembly, the cover 20 is brought to move downwardly through the bodies 32 of the columned fins 30 until the cover 20 reaches the heads 31. The plate fins 40 are interferentially engaged with the bodies 32 of the columned fins 30 and secured thereon. The heads 31 of the columned fins 30 are received in the recesses 11 of the base 10. The cover 20 is pressed toward the base 10 to thereby force the studs 12 of the base 10 to rivet into the orifices 22 of the cover 20, and intimately joint the base 10 and the cover 20 together. The columned fins 30 are thus secured on the base 10 by the joint of the bottom and covers 10, 20. Since the head 31 is higher than the recess 11, a portion of the cover 20 contacting the top end of the head 31 at a periphery of the hole 21 protrudes upwardly to form a substantially annular deformed part 23 during the pressing of the cover 10 toward the base 20.

The columned fins 30 are secured more tightly by the cover 20 due to the protrusion of the top ends of the heads 31 out of the recesses 11.

A heat conducting grease can be filled between the heads 31 of the columned fins 30 and the recesses 11 of the base 10 to reduce heat resistance therebetween.

FIGS. 4-7 illustrate a heat sink in accordance with a second embodiment of the present disclosure. The heat sink comprises a base 10a, a cover 20a mounted on a bottom of the base 10a, a plurality of columned fins 30a secured between the base 10a and the cover 20a, and a plurality of plate fins 40a engaged on the columned fins 30a.

The columned fins 30a and plate fins 40a have a same configuration with the columned fins 30 and plate fins 40 in the first embodiment and therefore a detailed description thereof is omitted.

A plurality of through holes extend through the base 10a; each through hole has a circular recess 11a defined in a bottom of the base 10a and a circular passage 13a defined in a top of the base 10a and communicating with the recess 11a. The passage 13a is smaller than the recess 11a. The recess 13a is 0.05-0.15 mm shorter than the head 31a of the columned fin 30a. The base 10a is configured that the bodies 32a of the columned fins 30a can pass through the passages 13a from the bottom thereof and the heads 31a are received in the recesses 11a with bottom ends thereof protruding out of the recesses 11. Two orifices 12a are defined in two diagonal corners of the base 10a.

The cover 20a is a thin plate and a thickness thereof is about a quarter of that of the base 10a. Two orifices 22a are defined in the cover 20a corresponding to the orifices 12a of the base 10a. A bottom of the cover 20a is for contacting the heat-generating component to dissipate heat.

Figure 7:
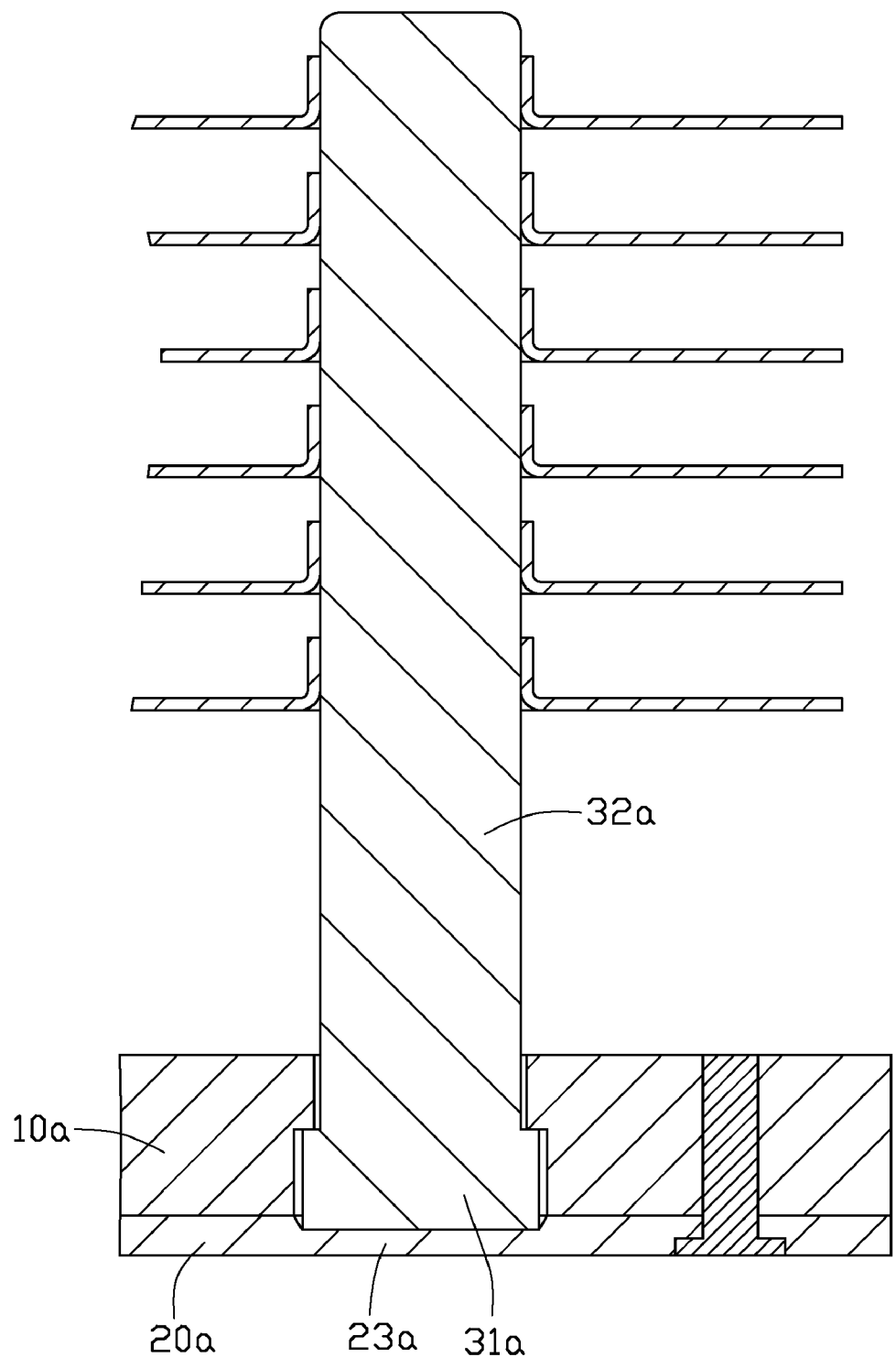
FIG. 7 is a view similar to FIG. 6, in which a cover of the heat sink has been machined.

In assembly, the bodies 32a penetrate through the passages 13a from the bottom of the base 10a, and the heads 31a are received in the recesses 11a of the base 10a. The cover 20a is attached to the bottom of the base 10a, and the cover 20a and the base 10a are jointed together by inserting rivets 50 into the orifices 12a, 22a of the base 10a and cover 20a and pressing the cover 20a and the rivets 50 from a bottom of the cover 20a upwardly toward the base 10a. The columned fins 30a are thus secured by the base 10a and cover 20a with heads 31a thereof sandwiched between the base 10a and cover 20a. Since the head 31a is higher than the recess 11a, a portion of the cover 20a contacting the bottom end of the head 31a of each columned fin 30a protrudes downwardly to form a deformed part 23a during the pressing. The plate fins 40a are pressed to interferentially engage with the bodies 32a of the columned fins 30a. At last, the deformed part 23a is machined to be flat with other portions of the bottom of the cover 20a as shown in FIG. 7, to avoid an interference of the heat-generating component contacting the bottom of the cover 20a.

It is understood that certain assembly steps previously described may be removed, while others may be added, and the sequence of steps may also be altered. For example, after the bodies 32 penetrated through the passages 13a of the base 10a, and the heads 31a of the columned fins 30a are received in the recesses 11a of the base 10a, the plate fins 40a can be interferentially engaged with the bodies 32a at first, and then the cover 20a is pressed toward the base 10a to join with the base 10a.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat sink comprising:
    a base with a plurality of recesses defined therein;
    a plurality of columned fins each having a head and a body extending from the head, the head being received in and higher than a corresponding recess of the base so that a portion of the head extending beyond the corresponding recess; and
    a cover jointing with the base and cooperating with the base to sandwich the heads of the columned fins therebetween to thereby secure the columned fins to the base, the cover having a portion thereof which contacts the head of each of the columned fins and forms a deformed part;
    wherein the recesses are defined at a bottom of the base, and a plurality of passages defined in a top of the base to communicate with the recesses and allow the bodies of the columned fins to penetrate therethrough, and wherein the cover covers on the bottom of the base, a portion of the cover which contacts a bottom end of the head of each of the columned fins protruding downwardly to form the deformed part; and
    wherein the deformed part is machined to be even with other parts of the cover.

2. The heat sink as claimed in claim 1, wherein the columned fins have different heights so that tops thereof are at different levels.

3. The heat sink as claimed in claim 1, further comprising a plurality of additional plate-shaped fins engaged on the bodies of the columned fins.

4. The heat sink as claimed in claim 1, wherein the head is 0.05-0.15 mm higher than the recess.

5. The heat sink as claimed in claim 1, wherein the base and the cover are jointed together by rivets.

6. The heat sink as claimed in claim 1, wherein a grease is filled between the recesses of the base and the heads of the columned fins.

7. The heat sink as claimed in claim 1, wherein the deformed part is formed during jointing the base and the cover together.

8. A method of manufacturing a heat sink, comprising:
    providing a plurality of columned fins each having a head and a body extending from the head;
    providing a base defining a plurality of recesses therein for receiving the heads of the columned fins, the heads being higher than the recesses;
    providing a cover;
    pressing the cover toward the base to sandwich the heads of the columned fins therebetween, wherein a portion of the cover which contacts the head of each of the columned fins forms a deformed part during the pressing.

9. The method as claimed in claim 8, wherein the cover defines a plurality of holes therein for the bodies of the columned fins passing through, and the cover covers on top of the base and top ends of the heads, and wherein a periphery of the cover defining each hole protrudes upwardly to form the deformed part.

10. The method as claimed in claim 8, wherein the recesses are defined at a bottom of the base, and a plurality of passages are defined in a top of the base to communicate with the recesses and allow the bodies of the columned fins to penetrate therethrough, and wherein the cover covers on the bottom of the base, a portion contacting a bottom end of the head of each of the columned fins protruding downwardly to form the deformed part.

11. The method as claimed in claim 10, further comprising machining the deformed part to be even with other parts of the cover.

12. The method as claimed in claim 8, wherein a plurality of studs are formed on the base, and a plurality of orifices are defined in the cover corresponding to the studs, the studs being pressed into the holes to combine the base and the cover together during the pressing step.

* * * * *